(12) United States Patent
Mohammadi et al.

(10) Patent No.: US 11,916,575 B2
(45) Date of Patent: Feb. 27, 2024

(54) DIGITAL MICROPHONE ASSEMBLY WITH IMPROVED MISMATCH SHAPING

(71) Applicant: Knowles Electronics, LLC, Itasca, IL (US)

(72) Inventors: Mohammad Sadegh Mohammadi, Lyngby (DK); Mohammad Shajaan, Copenhagen (DK)

(73) Assignee: KNOWLESELECTRONICS, LLC., Itasca, IL (US)

( * ) Notice: Subject to any disclaimer, the term of this patent is extended or adjusted under 35 U.S.C. 154(b) by 466 days.

(21) Appl. No.: 17/139,743

(22) Filed: Dec. 31, 2020

(65) Prior Publication Data

US 2022/0209789 A1     Jun. 30, 2022

(51) Int. Cl.
*H03M 3/00* (2006.01)
*B81B 7/00* (2006.01)
*H04R 1/04* (2006.01)
*H04R 3/02* (2006.01)
*H04R 19/04* (2006.01)

(52) U.S. Cl.
CPC ............ *H03M 3/464* (2013.01); *B81B 7/008* (2013.01); *H04R 1/04* (2013.01); *H04R 3/02* (2013.01); *H04R 19/04* (2013.01); *B81B 2201/0257* (2013.01); *B81B 2207/03* (2013.01); *H04R 2201/003* (2013.01)

(58) Field of Classification Search
None
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 2005/0207605 A1 | 9/2005 | Dehe et al. |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |

(Continued)

OTHER PUBLICATIONS

U.S. Appl. No. 16/874,503, filed May 14, 2020.
U.S. Appl. No. 17/096,499, filed Nov. 12, 2020.

*Primary Examiner* — Walter F Briney, III
(74) *Attorney, Agent, or Firm* — FOLEY & LARDNER LLP

(57) ABSTRACT

The present disclosure relates generally to digital microphone and other sensor assemblies including a transducer and a delta-sigma analog-to-digital converter (ADC) with digital-to-analog converter (DAC) element mismatch shaping and more particularly to sensor assemblies and electrical circuits therefor including a dynamic element matching (DELM) entity configured to select DAC elements based on data weighted averaging (DWA) and a randomized non-negative shift.

21 Claims, 7 Drawing Sheets

(56) References Cited

U.S. PATENT DOCUMENTS

| | | | |
|---|---|---|---|
| 2009/0224953 A1* | 9/2009 | Seo | H03M 1/066 327/334 |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2019/0387326 A1* | 12/2019 | Hansen | H03F 3/45183 |
| 2020/0010315 A1 | 1/2020 | Tingleff et al. | |

* cited by examiner

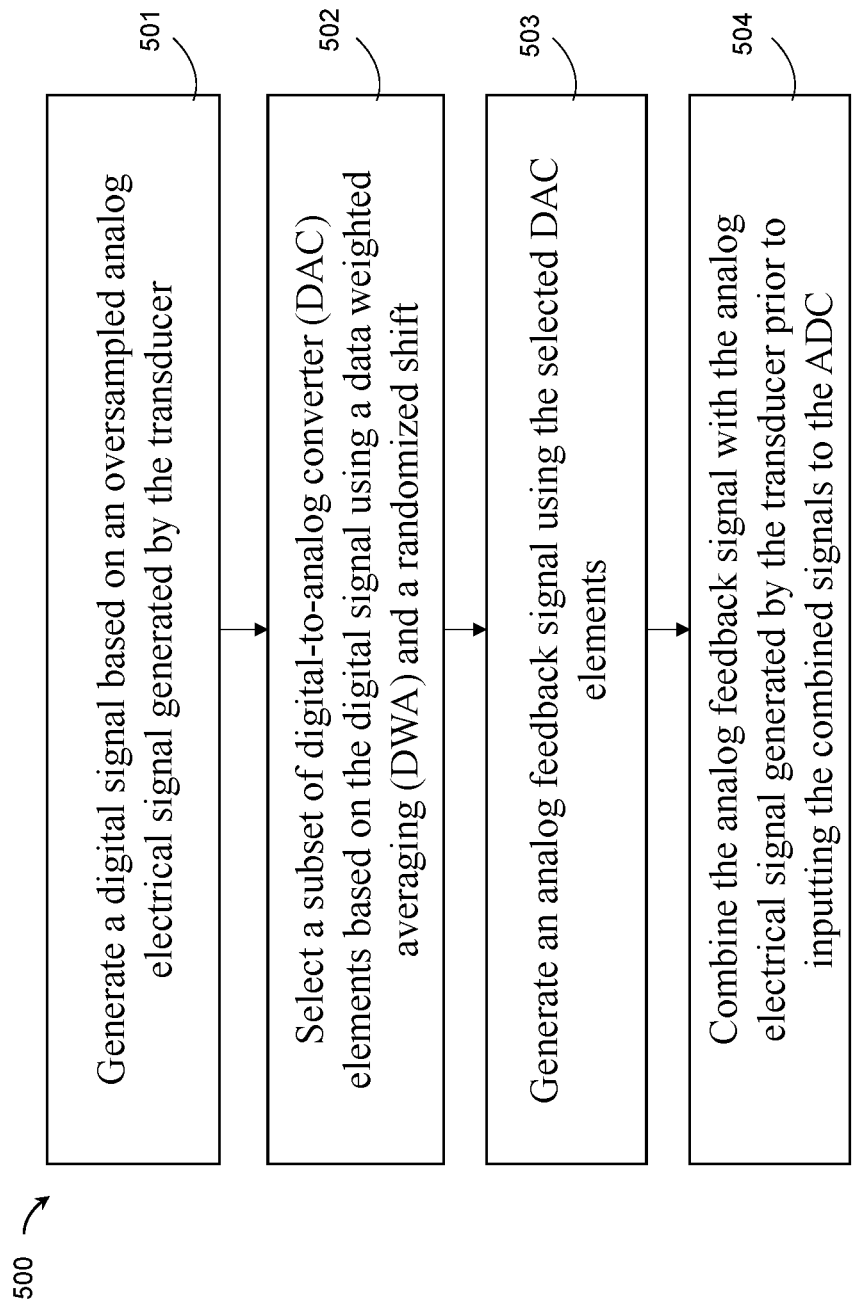

DIGITAL MICROPHONE ASSEMBLY WITH IMPROVED MISMATCH SHAPING

FIELD OF THE DISCLOSURE

The present disclosure relates generally digital microphone and other sensor assemblies and more particularly to digital sensor assemblies having improved dynamic range and reduced distortion.

BACKGROUND

Digital microphones having a transducer that converts sound into an electrical signal conditioned or processed by an integrated circuit are known generally and integrated with cell phones, personal computers, smart speakers and internet of things (IoT) devices, among other host devices. Such microphones and other sensors often comprise a delta-sigma analog-to-digital converter (ADC) having a digital-to-analog converter (DAC) in a feedback path of the ADC. The dynamic range of the processing circuit is related to the number of DAC elements available to produce the signal fed back to the input of the ADC. However mismatch among the DAC elements due to PVT variation and other causes distorts the feedback signal. Classic mismatch shaping algorithms such as data weighted averaging (DWA) that are used to address this problem produce undesirable spectral anomalies that adversely impact the performance of the sensor. Thus there is a need for improved mismatch shaping in digital microphone and other sensor assemblies.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

FIG. 5 is a flow diagram of a method of operating a sensor assembly implementing an improved mismatch shaping algorithm described herein.

Those of ordinary skill in the art will appreciate that the figures are illustrated for simplicity and clarity and therefore may not be drawn to scale and may not include well known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to digital microphone and other sensor assemblies including a transducer and a delta-sigma analog-to-digital converter (ADC) with digital-to-analog converter (DAC) element mismatch shaping and more particularly to sensor assemblies and electrical circuits therefor comprising a dynamic element matching (DELM) entity configured to select DAC elements based on data weighted averaging (DWA) and a randomized shift in successive sample periods.

Figure 1:
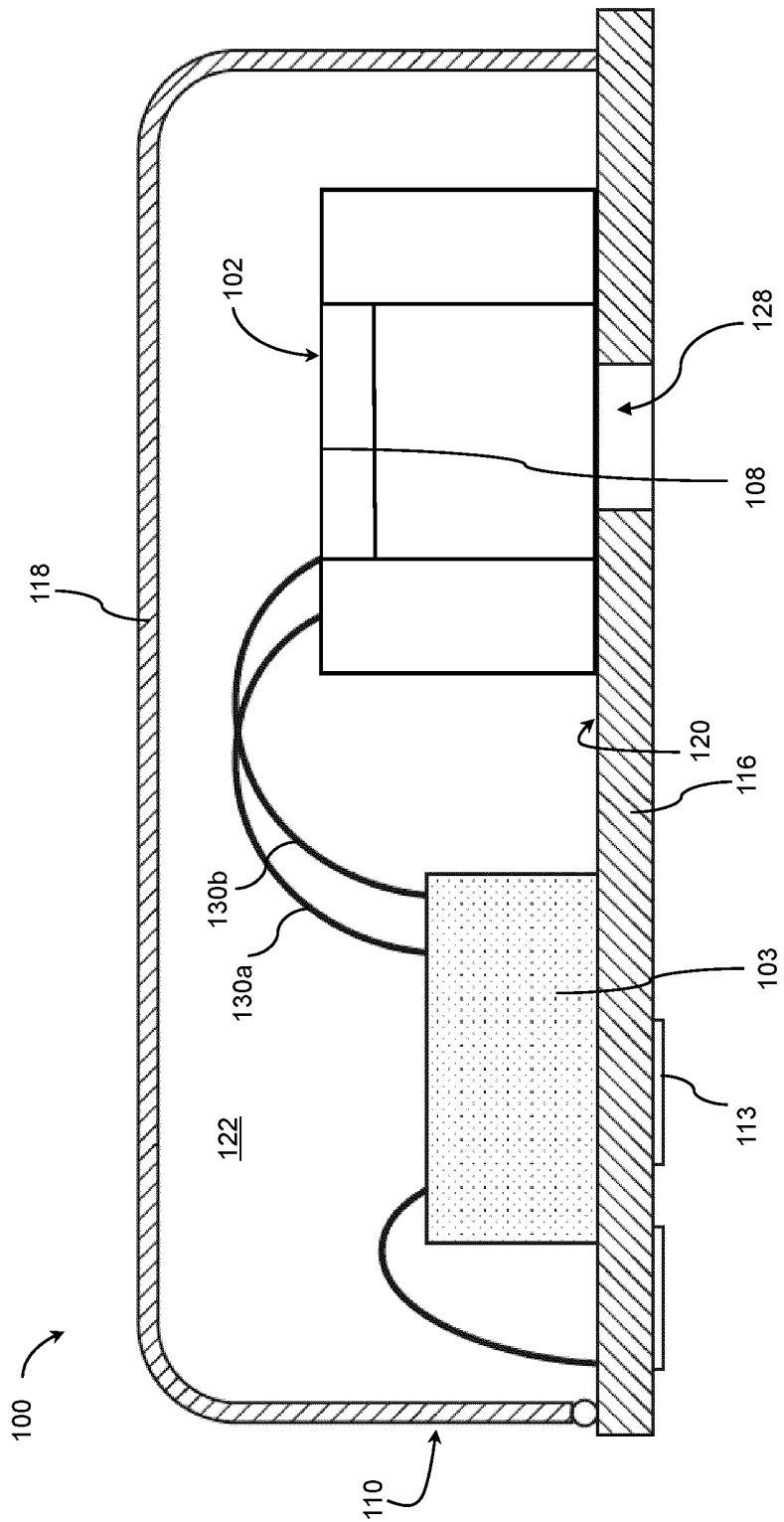
FIG. 1 is a cross-sectional view of a sensor assembly.

The sensor assembly generally comprises a transducer and an electrical circuit disposed in a housing configured to interface with a host device. FIG. 1 is a cross-sectional view of a sensor assembly 100 comprising a transducer 102 coupled to an electrical circuit 103 disposed within a housing 110. The housing includes a substrate 116 and a cover 118 fastened to an upper surface 20 of the substrate. The housing also includes an electrical interface with contacts (e.g., supply, ground, data, clock, select, etc.) configured to interface with a host device. In FIG. 1, the host-interface is a surface-mount interface 113 located on an outer surface of the substrate 116 and is suitable for reflow soldering processes. In other embodiments, the host-interface can have some other form factor, like through-hole pins, and be located on some other part of the housing.

In some sensor assemblies, like microphones, the housing includes an aperture (also called a "port" herein) connecting an interior of the housing to the external environment. In FIG. 1, the housing port 128 is located on the substrate 116 in alignment with the transducer 102. In other sensors, the port can be on some other part of the housing, like the cover or sidewall. A port is not required in other sensor assemblies, like acoustic vibration sensors and accelerometers, among others.

In one embodiment, the sensor assembly is a microphone configured to detect atmospheric acoustic signals and generate an electrical signal representative of the detected acoustic signals. In other embodiments, the sensor assembly is configured to detect and generate electrical signals representative of acoustic vibrations, pressure, acceleration, humidity or temperature among others. The transducer may be a capacitive, piezoelectric, optical or other transduction device implemented as a microelectromechanical systems (MEMS) device or as some other known or future device.

The electrical circuit generally comprises a processing circuit configured to process the electrical signal produced by the transducer and to provide the processed output signal at the host interface of the sensor assembly. In FIG. 1, the electrical circuit 103 is coupled to the transducer 102 via leads 130a and 130b and to contacts on the host interface 113 for this purpose. The electrical circuit can obtain power, clock and other signals from the host interface.

Figure 2:
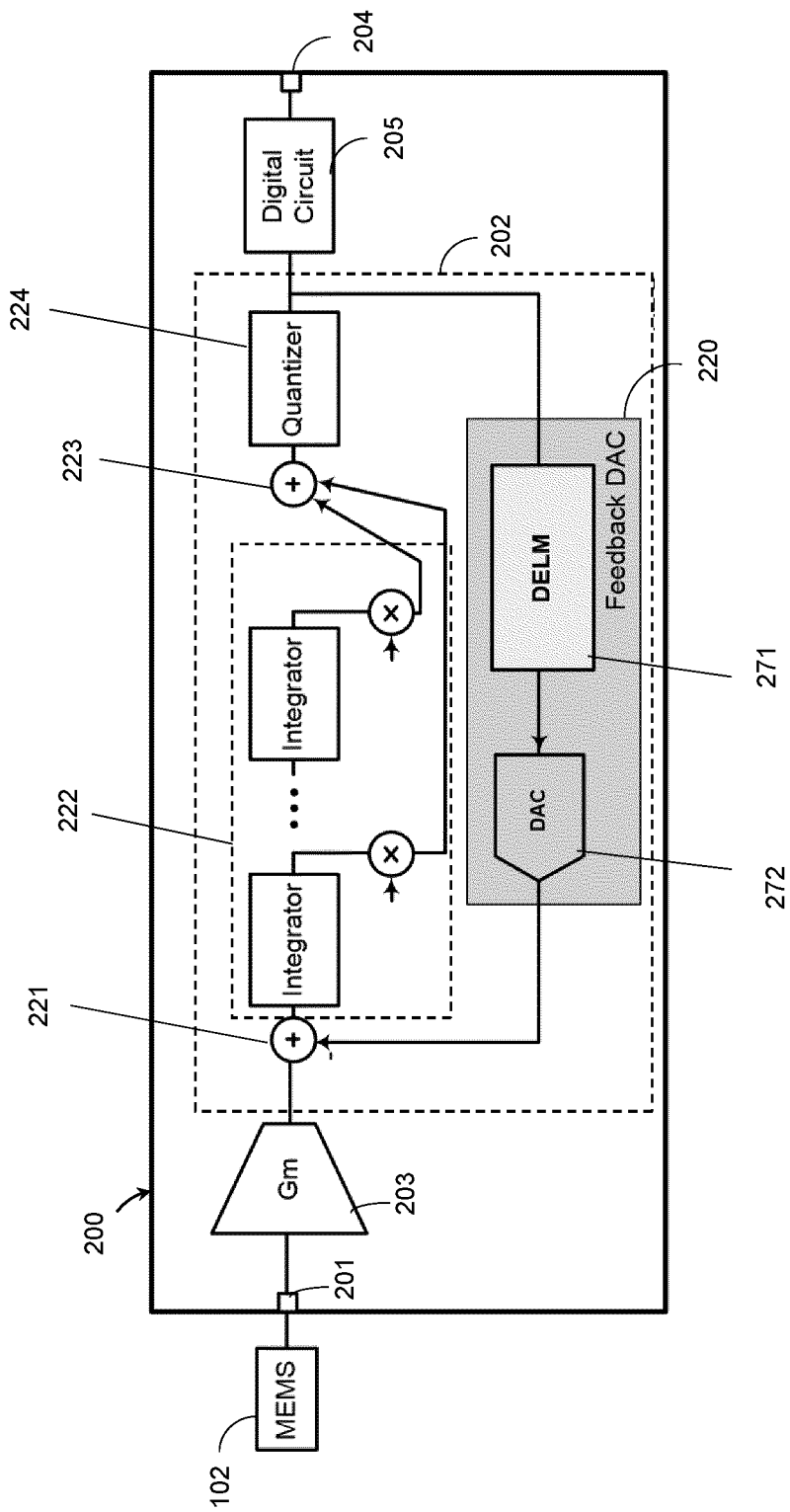
FIG. 2 is a schematic block diagram of a sensor assembly.

The processing circuit comprises a delta-sigma analog-to-digital converter (ADC) including a digital-to-analog converter (DAC) in a feedback path between the output of the ADC and input thereto. The ADC can be a multi-bit current or voltage delta-sigma modulator. In FIG. 2, the electrical circuit 200 comprises an input terminal 201 (e.g., a transducer interface) coupled to an analog input of a sigma-delta ADC 202 via a summer 221. The ADC includes a feed-forward path between the summer and a digital output coupled to an output terminal 204. In the sensor assembly operational process 500 of FIG. 5, at block 501, the ADC generates a digital signal based on an analog signal received from the transducer, before the digital signal is output at the host interface of the sensor assembly.

In some embodiments the processing circuit optionally includes a signal conditioning circuit between the transducer and the ADC. In FIG. 2, the conditioning circuit is a transconductance amplifier 203. Generally, the signal conditioning circuit can include a low noise amplifier, a buffer, filter or some combination of these and other signal conditioning circuits. The processing circuit can also optionally include a digital circuit 205 between the digital output of the ADC and the output terminal 204. The digital circuit processes the digital signal output by the ADC. In one implementation, the digital circuit is configured to format the digital signal for a particular digital protocol like PDM or Soundwire, among others. Alternatively, the electrical circuit can output a PCM format signal. The electrical circuit can also include other circuit elements, depending on the transducer type and the particular sensor configuration, some of which are described herein. The electrical circuit can be implemented as one or more integrated circuits (ICs). Such ICs can include, for example, an application specific integrated circuit (ASIC) with analog and/or digital circuits, a digital signal processor (DSP), among other ICs, alone or in combination.

Figure 3:
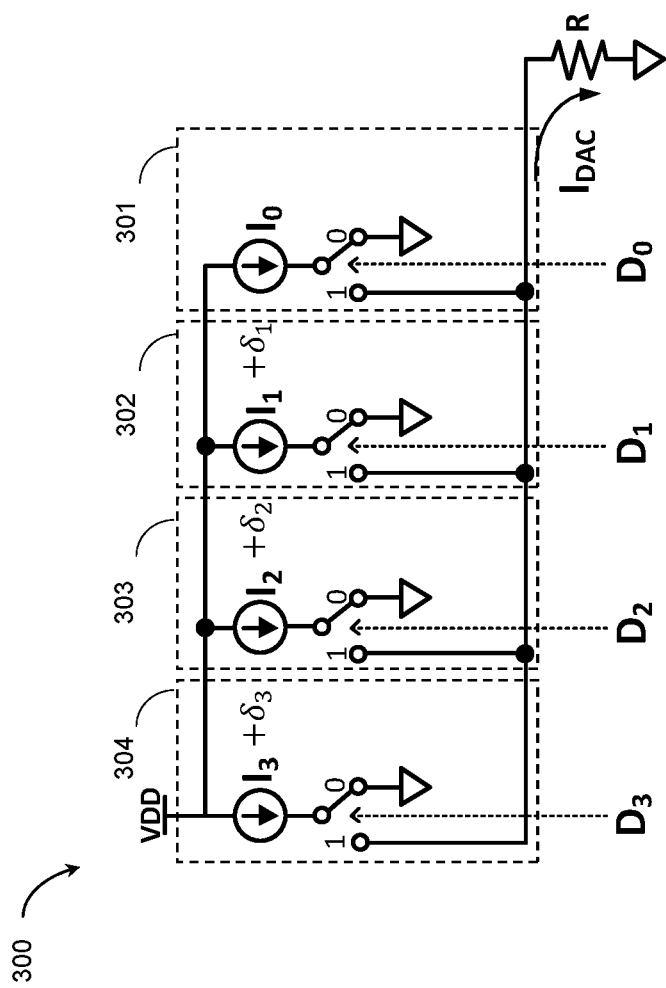
FIG. 3 is a schematic diagram of a multiple digital-to-analog circuit (DAC) elements.

In FIG. 2, the ADC 202 comprises a plurality of cascaded integrator stages 222 having an input coupled to the summer 221. Each integrator stage has an output coupled to a downstream integrator and to a quantizer 224. The digital output of the quantizer is coupled to the output terminal 204. The ADC also comprises a DAC 220 in a feedback path between the digital output of the ADC and the summer 221. The DAC comprises a plurality of DAC elements 272 used to generate a feedback signal input to the summer 221 and combined with the electrical signal from the transducer. The output of the summer is a difference signal. In FIG. 3, representative DAC elements are current elements 301-304 connected in parallel and configured to produce an analog current signal combined with a current output of the transconductance amplifier 203 in FIG. 2. The variation in current associated with the Nth DAC element is represented by $\delta_N$. Alternatively, the DAC elements can be voltage elements configured to produce a voltage signal combined at the summer with a voltage signal based on the electrical signal generated by the transducer.

Figure 4:
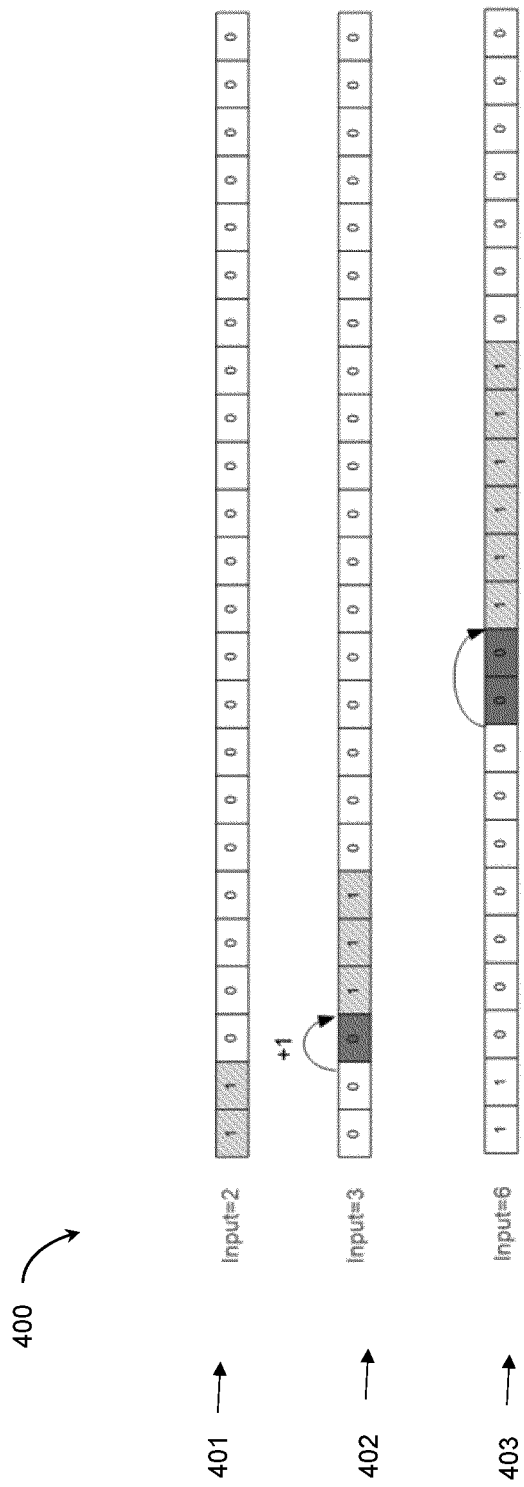
FIG. 4 is represents DAC elements enabled by a dynamic element matching (DELM) algorithm during successive processing periods.

The electrical circuit also comprises a dynamic element matching (DELM) entity coupled between the digital output of the ADC and the input to the DAC. In FIG. 2, the DELM entity 271 is shown as part of the DAC 220. The DELM entity is configured to select subsets of DAC elements based on a digital signal output by the ADC during successive sample periods. The number of DAC elements in the subset can be based on a magnitude of the digital signal. FIG. 4 shows a number of DAC elements selected for different digital input signals during successive sample periods 401-403, as described further herein.

The DELM entity is configured to sequentially select a subset of DAC elements based on the digital signal output by the ADC for each sample period using data weighted averaging (DWA) combined with a randomized shift from one sample period to the next. The modified DWA sequential selection scheme is also referred to herein as "dithered DWA selection". The dithered DWA selection is always unidirectional. In one implementation, the randomized shift is based on a positive integer number between zero and an absolute value threshold (inclusive), where the threshold corresponds to a percentage of a number of DAC elements N from which the subset of DAC elements is selected, rounded to a closest integer. In one implementation, the percentage is 10%. The randomized shift can be obtained from an uncorrelated Gaussian process or some other probability density function. In practice, the randomized shift can be generated using a pseudorandom generator, for example, a linear feedback shift register (LFSR) or some other low complexity pseudorandom generator. It suffices for the LFSR length to be at least ROUND (LOG 2(k×N)), where k is an integer equal to or greater than 10.

In the sensor assembly operational process 500 of FIG. 5, at block 502, the DELM selects the subset of DAC elements using DWA and a randomized shift. At block 503, selected subset of DAC elements generate an analog feedback signal. At block 504, the analog feedback signal is combined with the analog electrical signal generated by the transducer prior to inputting the combined (difference) signal to the ADC during each sample period.

Figures 6A, 6B:
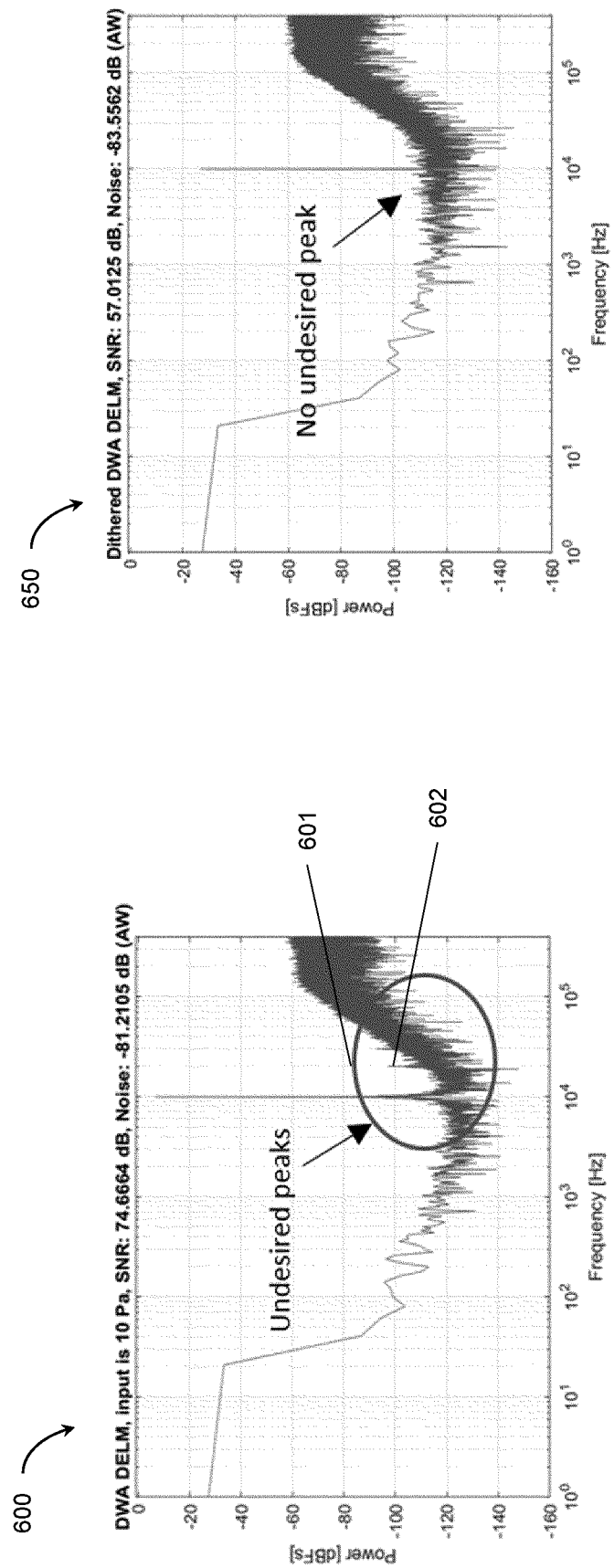
FIG. 6A depicts a frequency response (at a typical frequency and input amplitude) exhibiting undesirable spectral artifacts produced using a prior art data weighted averaging (DWA) mismatch shaping algorithm.
FIG. 6B depicts a frequency response (at the same input amplitude and frequency of FIG. 6A) exhibiting reduced distortion produced using an improved mismatch shaping algorithm described herein.

Noise in the digital signal output by the ADC can be shifted outside the frequency band of interest by applying the modified DWA to a digital signal obtained by quantizing an oversampled analog signal input to the ADC. The DWA selection scheme combined with a randomized shift reduces spectral artifacts associated with variation in the DAC elements. Prior art FIG. 6A is a plot 600 of power versus frequency for DAC element selection using an unmodified prior art DWA selection scheme. Plot 600 shows spectral anomalies manifest as undesirable power peaks 601 and 602, corresponding to idle tones and harmonic distortion. FIG. 6B is a plot 650 of power versus frequency for DAC element selection using a modified DWA selection scheme including a randomized shift. Plot 650 is devoid of undesirable power peaks afflicting the prior art DWA selection scheme.

In FIG. 4, during a first sample period 401, the DAC Input=2, the randomized shift=0, and first and second DAC elements are selected for a DAC Input=2. In the second sample period 402, the DAC Input=3, the randomized shift=+1, and DAC elements 4-6 are selected. In the third sample period 403, the DAC Input=6, the randomized shift=+2, and DAC elements 6-9 are selected. Generally, the randomized shift from one sample period to the next is not sequential as shown in FIG. 4 since the shift is based on a random selection.

A DWA selection scheme combined with a randomized shift can be implemented by a low complexity algorithm with low hardware overhead (i.e., a small IC area requirement), compared to higher order spectral noise shaping solutions having greater complexity. In one implementation the modified DWA selection is unidirectional and the randomized shift occurs in a direction that prevents overlapping selection of DAC elements for adjacent sample periods (i.e., the randomized shift occurs in the same direction as the unidirectional DWA selection). Implementation of an LSFR for this purpose adds little marginal complexity to a DWA selection scheme.

Figure 7:
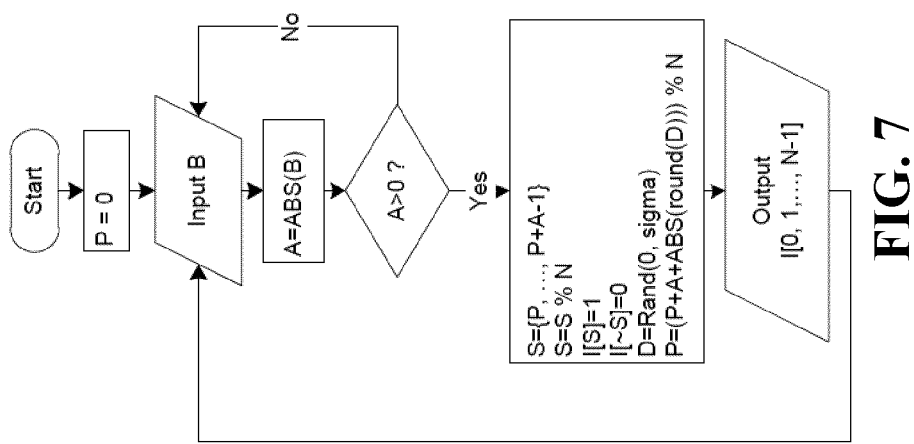
FIG. 7 is a block flow diagram for a modified DWA DAC element selection algorithm.

The DELM functionality can be implemented as an algorithm in the DAC, for example, the DAC 220 in FIG. 1. An algorithmic flowchart for the dithered DWA selection is shown in FIG. 7 where N represents the total number of DAC elements, B represents the input to the feedback DAC, and I[0, . . . N−1] is the array of DAC elements. In the flowchart, % represents the "mod" operation, S represents the set of flagged elements and its complement ~S. The Rand( ) function generates samples of an uncorrelated Gaussian process, which can be approximated using an LFSR or other pseudorandom generator.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described but by the appended claims and their equivalents.

What is claimed is:

1. A digital sensor assembly comprising:
    a transducer configured to generate an electrical signal upon detecting an environmental condition;
    a delta-sigma analog-to-digital converter (ADC) having an input coupled to the transducer and configured to output a digital signal based on the electrical signal, the ADC comprising a digital-to-analog converter (DAC) comprising a plurality of DAC elements in a feedback path of the ADC; and
    a dynamic element matching (DELM) entity coupled between the output of the ADC and the DAC, the DELM entity configured to select a subset of DAC elements for each sample period using data weighted averaging (DWA) combined with a randomized shift of a selected subset of DAC elements from one sample period to the next,
    wherein the selected subset of DAC elements contribute to an analog feedback signal that is combined with the electrical signal prior to input to the ADC during each sample period.

2. The sensor assembly of claim 1, wherein the ADC is a multi-bit delta-sigma modulator and the DELM entity is configured to determine a number of the DAC elements in the selected subset of DAC elements based on a magnitude of the digital signal.

3. The sensor assembly of claim 2, wherein the DELM entity is configured to sequentially select the subset of DAC elements from among the plurality of DAC elements from one sample period to the next, wherein the randomized shift occurs in a direction that prevents overlapping selection of DAC elements for adjacent sample periods.

4. The sensor assembly of claim 3, wherein the randomized shift is based on an integer number between zero and a threshold, inclusive.

5. The sensor assembly of claim 4, wherein the threshold corresponds to 10 percent of a number of DAC elements constituting the plurality of DAC elements, rounded to a closest integer.

6. The sensor assembly of claim 5 further comprising a linear feedback shift register configured to implement the randomized non-negative shift.

7. The sensor assembly of claim 2, wherein the DELM entity is configured to sequentially select the subset of DAC elements by randomly shifting the selection of the subset of DAC elements in a forward direction, such that the randomized shift is unidirectional and non-overlapping.

8. The sensor assembly of claim 1, further comprising an interface circuit between the transducer and an input node of the ADC, wherein the interface circuit and the ADC are part of an integrated circuit.

9. The sensor assembly of claim 1 further comprising a housing having an external-device interface, the transducer and the ADC are disposed in the housing, wherein an output of the ADC is electrically coupled to contacts on the external-device interface.

10. The sensor assembly of claim 9 is a microphone, wherein the transducer is a microelectromechanical systems (MEMS) transducer acoustically coupled to a sound port in the housing.

11. The digital sensor assembly of claim 1, wherein:
    the randomized shift of the selected subset of DAC elements is made relative to selected DAC elements from a prior sample period.

12. An integrated circuit configured to be coupled to a transducer, the integrated circuit comprising:
    a multi-bit delta-sigma analog-to-digital converter (ADC) having a forward path input coupled to the transducer and configured to output a digital signal based on an electrical signal, the ADC comprising a digital-to-analog converter (DAC) comprising a plurality of DAC elements in a feedback path of the ADC; and
    a dynamic element matching (DELM) entity coupled between the output of the ADC and the DAC, the DELM entity configured to select a subset of DAC elements for each sample period using data weighted averaging (DWA) modified to include a randomized shift of a selected subset of DAC elements from one sample period to the next,
    wherein the selected subset of DAC elements contribute to an analog feedback signal that is combined with the electrical signal prior to input to the forward path of the ADC during each sample period.

13. The circuit of claim 12, wherein the DELM entity is configured to determine a number of the DAC elements in the selected subset of DAC elements based on a magnitude of the digital signal.

14. The sensor assembly of claim 13, wherein the DELM entity is configured to sequentially select the subset of DAC elements from among the plurality of DAC elements from one sample period to the next, wherein the randomized shift occurs in a direction that prevents overlapping selection of DAC elements for adjacent sample periods.

15. The sensor assembly of claim 14, wherein the randomized shift is based on an integer number between zero and a threshold, inclusive.

16. The sensor assembly of claim 15, wherein the threshold corresponds to 10 percent of a number of DAC elements constituting the plurality of DAC elements, rounded to a closest integer.

17. A method of operating a sensor assembly comprising a multi-bit delta-sigma analog-to-digital converter (ADC) coupled to a transducer, the method comprising:
    generating a digital signal by quantizing a sampled analog electrical signal generated by the transducer;
    selecting a subset of digital-to-analog converter (DAC) elements of the ADC for each sample period using a data weighted averaging (DWA) algorithm modified to include a random linear shift of a selected subset of DAC elements;
    generating an analog feedback signal using the selected DAC elements; and
    subtracting the analog feedback signal from the analog electrical signal prior to inputting a difference signal to the DAC,
    wherein noise in the digital signal output by the ADC is shifted outside a frequency band of interest.

18. The method of claim 17 further comprising determining a number of DAC elements in the selected subset of DAC elements based on a magnitude of the digital signal output by the ADC.

19. The method of claim 18 further oversampling the analog electrical signal generated by the transducer before quantizing, and noise shaping the digital signal, wherein noise in the digital signal is shifted outside the frequency band of interest.

20. The method of claim 19 further comprising sequentially selecting the DAC elements using a unidirectional DWA selection scheme modified with randomized shift during each sample period, wherein the randomized shift occurs in the same direction as the unidirectional DWA selection.

21. The method of claim 20 further comprising generating the randomized shift for each sample period using a pseudorandom generator.

* * * * *